US006884737B1

(12) United States Patent
Blackburn et al.

(10) Patent No.: US 6,884,737 B1
(45) Date of Patent: Apr. 26, 2005

(54) METHOD AND APPARATUS FOR PRECURSOR DELIVERY UTILIZING THE MELTING POINT DEPRESSION OF SOLID DEPOSITION PRECURSORS IN THE PRESENCE OF SUPERCRITICAL FLUIDS

(75) Inventors: Jason M. Blackburn, Sunnyvale, CA (US); Jeremie Dalton, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 31 days.

(21) Appl. No.: 10/232,491

(22) Filed: Aug. 30, 2002

(51) Int. Cl.[7] .......... H01L 21/31

(52) U.S. Cl. .......... 438/758; 438/393

(58) Field of Search .......... 438/758, 393, 438/239

(56) References Cited

U.S. PATENT DOCUMENTS

| | | | | | |
|---|---|---|---|---|---|
| 4,737,384 | A | | 4/1988 | Murthy et al. | 427/369 |
| 4,970,093 | A | | 11/1990 | Sievers et al. | 427/38 |
| 5,185,296 | A | | 2/1993 | Morita et al. | 437/229 |
| 5,304,515 | A | | 4/1994 | Morita et al. | 437/231 |
| 5,652,192 | A | * | 7/1997 | Matson et al. | 502/304 |
| 5,665,527 | A | | 9/1997 | Allen et al. | 430/325 |
| 5,710,187 | A | | 1/1998 | Steckle, Jr. et al. | 521/64 |
| 5,750,790 | A | * | 5/1998 | King | 564/469 |
| 5,789,027 | A | | 8/1998 | Watkins et al. | 427/250 |
| 5,997,956 | A | * | 12/1999 | Hunt et al. | 427/446 |
| 6,106,896 | A | * | 8/2000 | Nielsen et al. | 427/195 |
| 6,124,226 | A | * | 9/2000 | Nielsen et al. | 502/9 |
| 6,132,653 | A | * | 10/2000 | Hunt et al. | 264/5 |
| 6,180,151 | B1 | * | 1/2001 | Geng et al. | 426/448 |
| 6,207,522 | B1 | * | 3/2001 | Hunt et al. | 438/393 |
| 6,403,414 | B1 | * | 6/2002 | Marsh | 438/239 |
| 6,592,938 | B1 | * | 7/2003 | Pessey et al. | 427/212 |
| 2002/0046707 | A1 | | 4/2002 | Biberger et al. | 118/733 |

OTHER PUBLICATIONS

U.S. Appl. No. 09/727,796, file date: Nov. 30, 2000.
U.S. Appl. No. 10/016,017, file date: Dec. 12, 2001.

* cited by examiner

*Primary Examiner*—John F. Niebling
*Assistant Examiner*—Olivia Luk
(74) *Attorney, Agent, or Firm*—Beyer Weaver & Thomas LLP

(57) ABSTRACT

A method for providing a precursor to a supercritical processing chamber is provided. The precursor in solid form is provided in an ampoule external to the supercritical processing chamber. A fluid is provided to the ampoule, where at least a portion of the gas enters the solid precursor causing a melting point of the precursor to be depressed and thereby causing the solid precursor to melt. The melted precursor is delivered to the supercritical process chamber.

11 Claims, 7 Drawing Sheets

METHOD AND APPARATUS FOR PRECURSOR DELIVERY UTILIZING THE MELTING POINT DEPRESSION OF SOLID DEPOSITION PRECURSORS IN THE PRESENCE OF SUPERCRITICAL FLUIDS

FIELD OF THE INVENTION

This invention relates to methods and apparatus for processing substrates. More particularly, it relates to methods and apparatus for delivering solid precursors as liquids via melting point reduction using supercritical fluids.

BACKGROUND OF THE INVENTION

Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the reduced temperature and pressure of a solution are both greater than 80% of their critical point but the solution is not yet in the supercritical phase. Due to their high density, supercritical and near supercritical fluids possess superior solvating properties.

Supercritical fluids have been used in thin film processing as developer reagents or extraction solvents. Morita et al. (U.S. Pat. Nos. 5,185,296 and 5,304,515) describe a method in which supercritical fluids are used to remove unwanted organic solvents and impurities from thin films deposited on substrates. Allen et al. (U.S. Pat. No. 5,665,527) describe a high resolution lithographic method in which a supercritical fluid is used to selectively dissolve a soluble unexposed portion of polymeric material from a substrate, thereby forming a patterned image. In recognition of the superior solvating properties of supercritical fluids, Steckle et al. (U.S. Pat. No. 5,710,187) describe a method for removing impurities from highly cross-linked nanoporous organic polymers.

Methods for depositing thin films using supercritical fluids also have been reported. Murthy et al. (U.S. Pat. No. 4,737,384) describe a method for depositing metals and polymers onto substrates using supercritical fluids as the solvent medium. Sievers et al. (U.S. Pat. No. 4,970,093) describe a chemical vapor deposition method (CVD), in which a supercritical fluid is used to dissolve and deliver a precursor in aerosol form to a conventional CVD reactor. Watkins et al. (U.S. Pat. No. 5,789,027) describe a method termed Chemical Fluid Deposition (CFD) for depositing a material onto a substrate surface. In this method, a supercritical fluid is used to dissolve a precursor of the material to be deposited. Once dissolved, a reaction reagent is introduced that initiates a chemical reaction involving the precursor, thereby depositing the material onto the substrate.

Although the above-mentioned methods take advantage of supercritical fluids as mediums for reagent transport, reaction, and removal of impurities, what is lacking in the art are more reliable and practical apparatus and methods for providing a high concentration of precursor to a process chamber. Conventional methods and apparatus may provide a solid precursor directly to the process chamber. The precursor may then be melted or dissolved in the process chamber, possibly by heating the precursor. Some of the difficulties of such processes are the difficulty of measuring solid precursor and delivering solid precursor to a process chamber. In addition, many solid precursors have melting points, which are near or above their thermal decomposition temperatures thus preventing them from being stored as liquids for long periods of time.

What are therefore needed are improved apparatus and methods for providing precursor in a process chamber.

SUMMARY OF THE INVENTION

To achieve the foregoing and in accordance with the purpose of the present invention, a method for providing a solid precursor in liquid form to a supercritical processing chamber is provided. The solid precursor is provided in a vessel external to the supercritical processing chamber. A fluid is provided to the ampoule, where at least a portion of the fluid enters the solid precursor, which provides a melting point depression for the solid precursor. The solid precursor is melted within the vessel. The melted precursor is then delivered to the supercritical processing chamber.

In another embodiment of the invention an apparatus for processing a wafer is provided. A supercritical processing chamber for supporting the wafer is provided. An ampoule for receiving a solid precursor is provided. An inlet to provide a fluid to the ampoule to depress the melting point of the precursor is connected to the ampoule. A heater configured to heat the precursor to the depressed melting point of the precursor is provided. An outlet for removing the solid precursor as a melt and delivering the melt to the supercritical processing chamber is connected between the ampoule and the supercritical processing chamber. A meter for measuring the amount of the melt delivered to the processing chamber is provided.

In another embodiment of the invention an apparatus for providing a melted precursor to a processing chamber is provided. An ampoule containing a solid precursor is provided. An inlet is connected to the ampoule for providing a fluid into the ampoule to lower the melting point of the precursor. A device for facilitating the heating of the precursor to the lowered melting point of the precursor is connected to the ampoule. An outlet is connected to the ampoule for providing the precursor as a melt to the processing chamber. A pump for pumping the melt to the processing chamber is provided.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
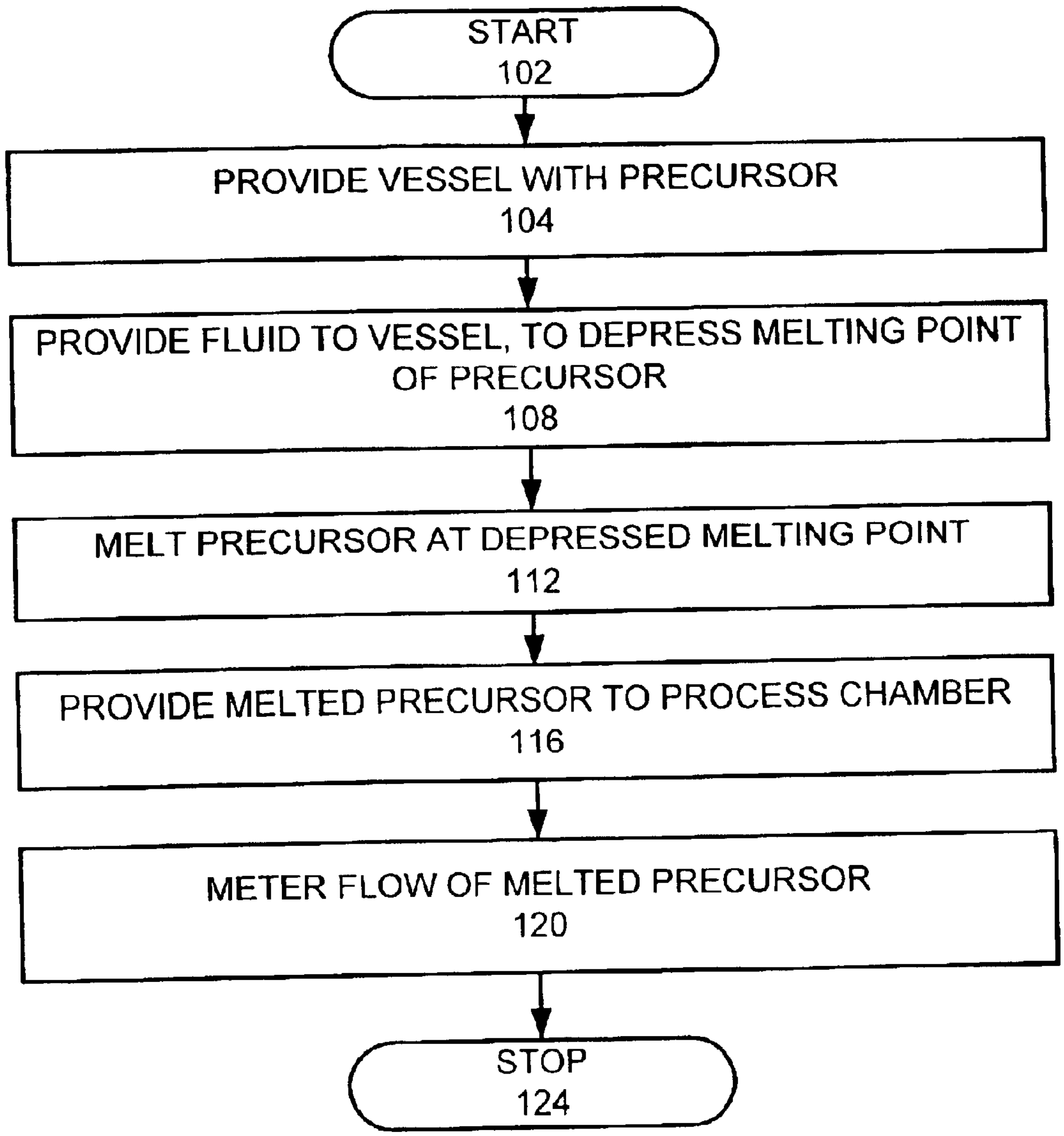
FIG. 1 is a high level flow chart of a process used in an embodiment of the invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described in terms of methods and apparatus in relation to a supercritical fluid reactor for semiconductor wafer processing. The invention is not limited to semiconductor wafer processing. A substrate or work piece may be of various shapes, sizes, and materials. In addition to semiconductor wafers, other work pieces that may take advantage of this invention include various articles such as machine tools, weaponry, recording heads, recording media, storage medias, and the like. As the invention is described generally in terms of depositing a precursor on a wafer, the invention can also be used for cleaning or otherwise treating wafers with supercritical fluid media. In some descriptions herein, well-known processes, procedures, and components have not been described in detail so as not to unnecessarily obscure aspects of the present invention.

In this application, the term "wafer" may be used interchangeably with "partially fabricated integrated circuit". One skilled in the art would understand that the terms "wafer" and "partially fabricated integrated circuit" can refer to a silicon wafer during any of many stages of integrated circuit fabrication thereon. Preferably, the invention is used as part of a damascene process on a wafer using copper. However, as mentioned, the invention is not so limited.

As mentioned, supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the reduced temperature and pressure of a solution are both greater than 80% of their critical point but the solution is not yet in the supercritical phase. In this application, the term "supercritical fluid" is meant to refer to both supercritical and near supercritical fluids.

Also, the term "precursor" is used. In this application, the term "precursor" means any solid precursor. Generally, this means materials that are solids at standard temperature and pressure (STP), that is, twenty-five degrees Celsius and 760 torr. Thus, a precursor can be, for example, a solid material that has its melting point lowered when exposed to a supercritical fluid, is melted, and deposited on a wafer, without changing the molecular structure of the precursor material from its native form. Alternatively, a precursor can be a solid material that, when exposed to a supercritical fluid to lower the melting point and then melted, is transported to a reactor where it is transformed or converted by a chemical reaction or modified in some way so as to become part of or incorporated into the product molecules of a deposited layer.

One skilled in the art would understand that apparatus described herein are constructed of heavy gauge stainless steel or other materials necessary to handle and control supercritical fluids. Such equipment may be able to withstand pressures of several thousand pounds per square inch and be resistant to the superior solvating properties of solvents when brought to supercritical conditions. Also, such equipment may be assembled from commercially available components or fabricated.

Generally, the invention is embodied in apparatus and methods for utilizing the melting point depression of solid deposition precursors in the presence of high pressure supercritical fluid to melt the solid precursor and provide a high concentration liquid precursor. The concentration of the precursor in the resulting melted precursor should be significantly higher than the concentration of the fluid. That is, in order for the melting point of the solid precursor to be lowered, at least some molecules of the supercritical fluid must enter the solid matrix of the material. Once melted, the liquid precursor will retain at least a finite amount of the supercritical fluid. For the purposes of this invention, this is considered a melt of the solid precursor or a liquid form of the solid precursor. The invention takes advantage of the use of SC fluids to lower the melting point such that the precursors can be stored as liquids for long periods of time at a temperature that is well below the normal melting point and the thermal decomposition temperature.

Preferably apparatus described below are made of materials that can withstand the high pressures associated with supercritical fluid processing as well as the corrosive nature of such processing fluids. In some cases, strong acids or bases may be used with supercritical solvents to perform a particular process. Preferably, apparatus of the invention include components that are made of at least one of hastalloy, stainless steel, inconel, and the like.

Figure 2A:
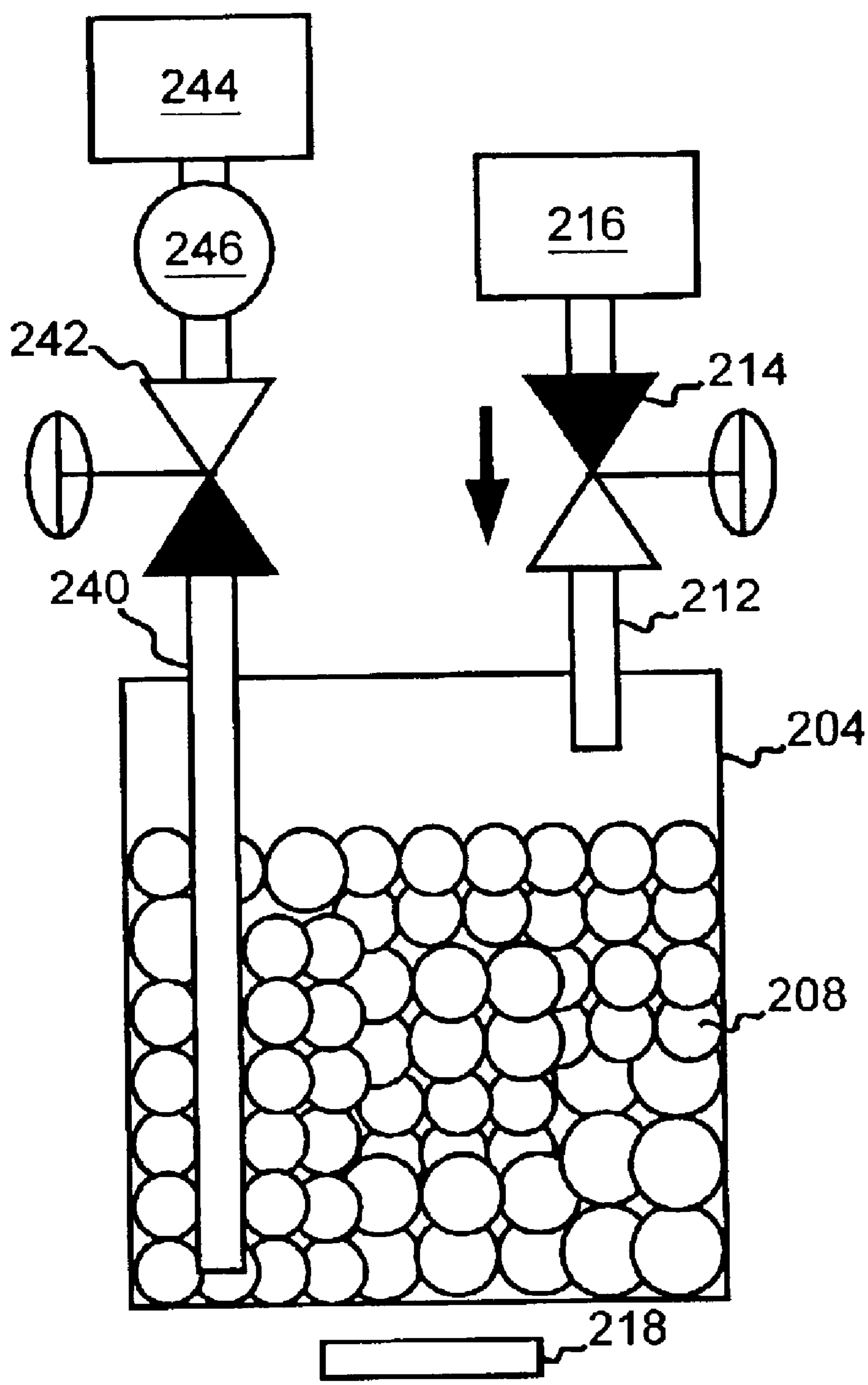
FIGS. 2A–B are schematic views of a device used in an embodiment of the invention.

FIG. 1 is a high level flow chart of a process used in an embodiment of the invention. A vessel, such as an ampoule, with a precursor is provided (step 104). FIG. 2A is a schematic view of a vessel 204 with a precursor 208. The precursor 208 is preferably a material that is solid at standard temperature and pressure (STP), that is, twenty-five degrees Celsius and 760 torr, and is therefore shown in a solid form in FIG. 2A. The vessel 204 has an inlet 212 for introduction of a fluid. The inlet 212 is connected to a first one-way control valve 214, which is connected to a fluid source 216. The fluid is provided into the vessel (step 108). The fluid may be provided from the fluid source 216 through the control valve 214 and through the inlet 212. Preferably the fluid is supercritical, although the fluid (or gas) may enter vessel 204 subcritical and then be brought to supercritical conditions. A particularly preferred fluid of the invention is supercritical carbon dioxide. For example, liquid carbon dioxide may be introduced into vessel 204 and then brought to supercritical conditions or alternatively supercritical carbon dioxide may be introduced directly into vessel 204. Some of the fluid dissolves into the solid precursor 208, which causes a lowering of the melting point of the precursor, through melting point depression. The precursor is then melted at the depressed melting point (step 112). If the ambient temperature is higher than the depressed melting point of the precursor, then the ambient temperature is used to melt the precursor mixture. If the ambient temperature is below the depressed melting point, then a heat source (for example, a heater 218 external to vessel 204) may be used to raise the temperature of the precursor above its depressed melting point to melt the precursor. The heater 218 could be one of a variety of heaters, which for example may be but is not limited to a bottom heater (as shown in FIG. 2A), a jacket heater, or an internal cartridge heater.

Figure 2B:
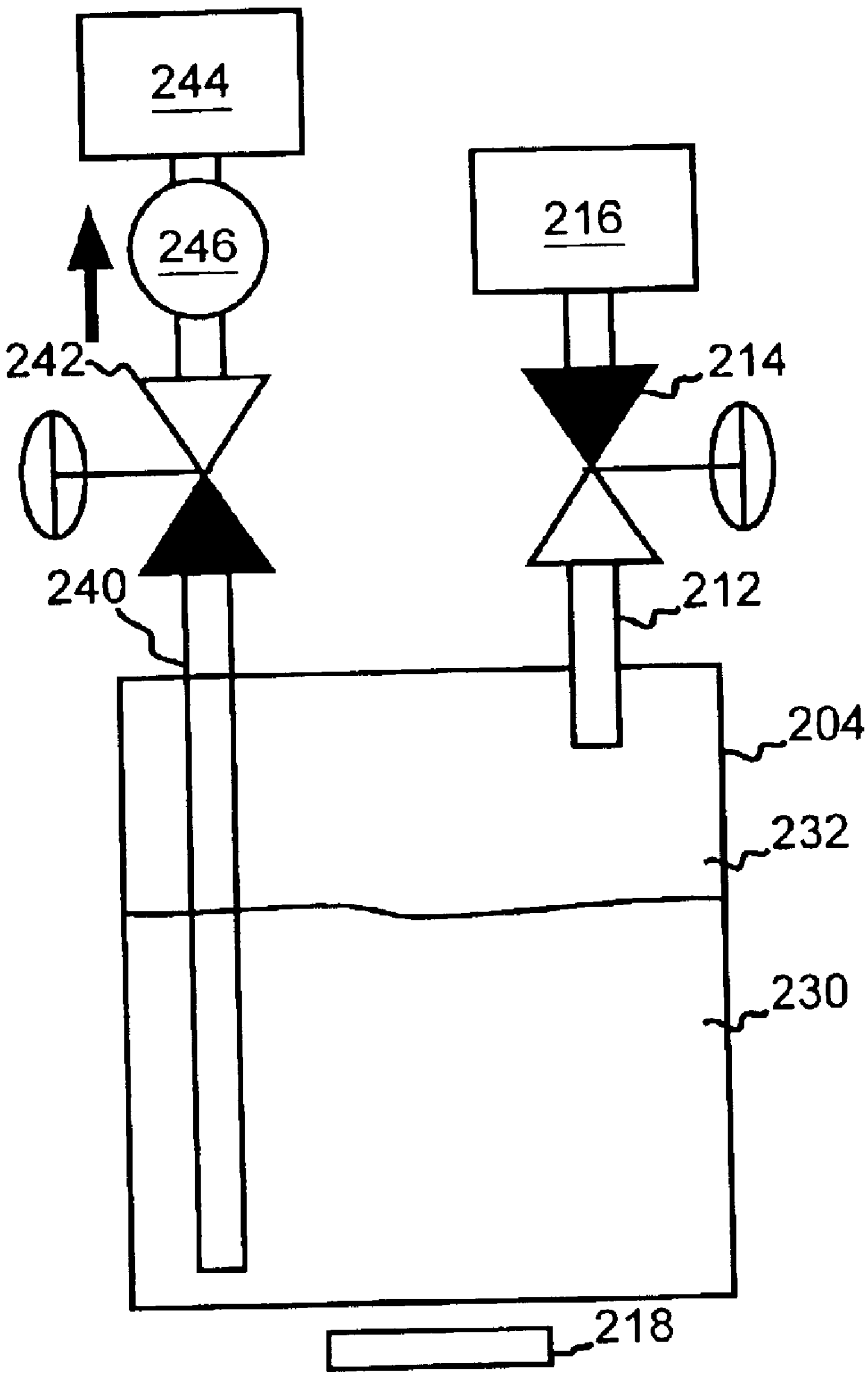

FIG. 2B illustrates the vessel 204 with the melted precursor 230. The melted precursor 230 has a very high concentration of melted precursor and a small amount of the supercritical fluid dissolved into the melted precursor. Above the melted precursor 230 may be a mixture 232 of mainly supercritical fluid with small amounts of precursor dissolved in the supercritical fluid.

The melted precursor 230 is then provided to a process chamber (step 116). An outlet 240 (e.g. an eductor tube) is connected to a second control valve 242, which is connected to a process chamber 244. Pressure may be applied to the melted precursor 230 to pump the melted precursor out of vessel 204, through outlet 240, through control valve 242, and into process chamber 244. Pressure from the fluid may be used to increase the pressure in the vessel 204 to provide the pressure to move the melted precursor. A meter 246 may be provided to measure the amount of the melted precursor that is provided to the process chamber 244.

Figure 3A:
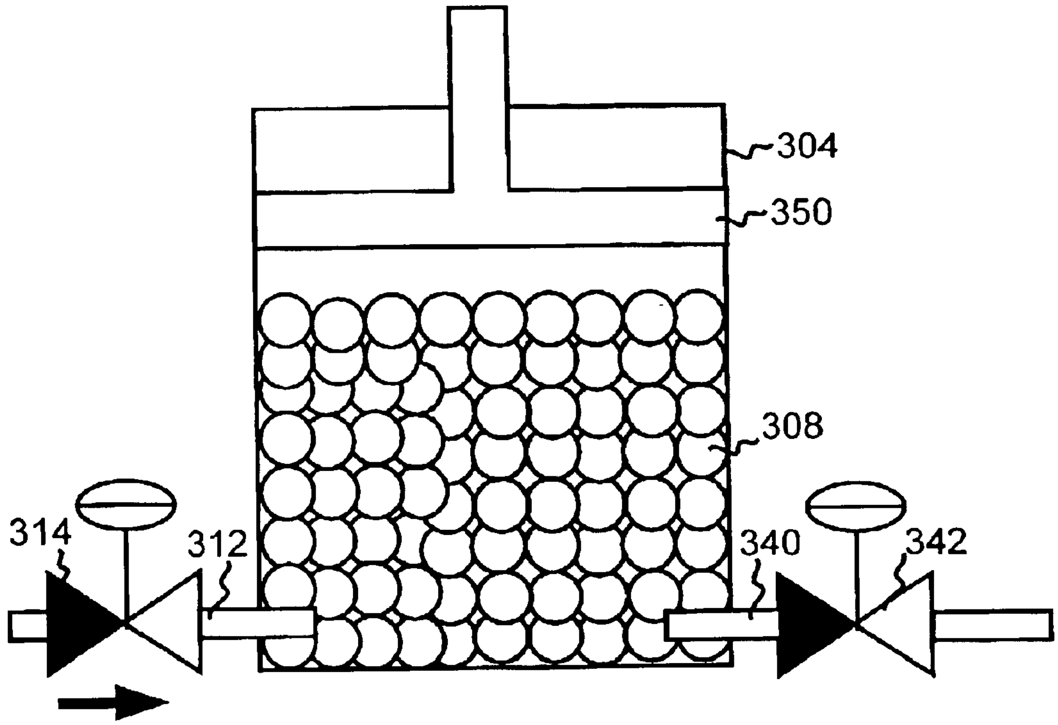
FIGS. 3A–B are schematic views of another device used in another embodiment of the invention.

FIG. 3A is a schematic illustration of another vessel 304, which may be used in an embodiment of the invention. As in the previous embodiment, the vessel is provided with a precursor 308. An inlet 312 is connected to a first control valve 314, which is connected to a fluid source (not shown). An outlet 340 is connected to a second control valve 342, which is connected to a process chamber (not shown). A piston 350 for providing pressure is also provided.

Figure 3B:
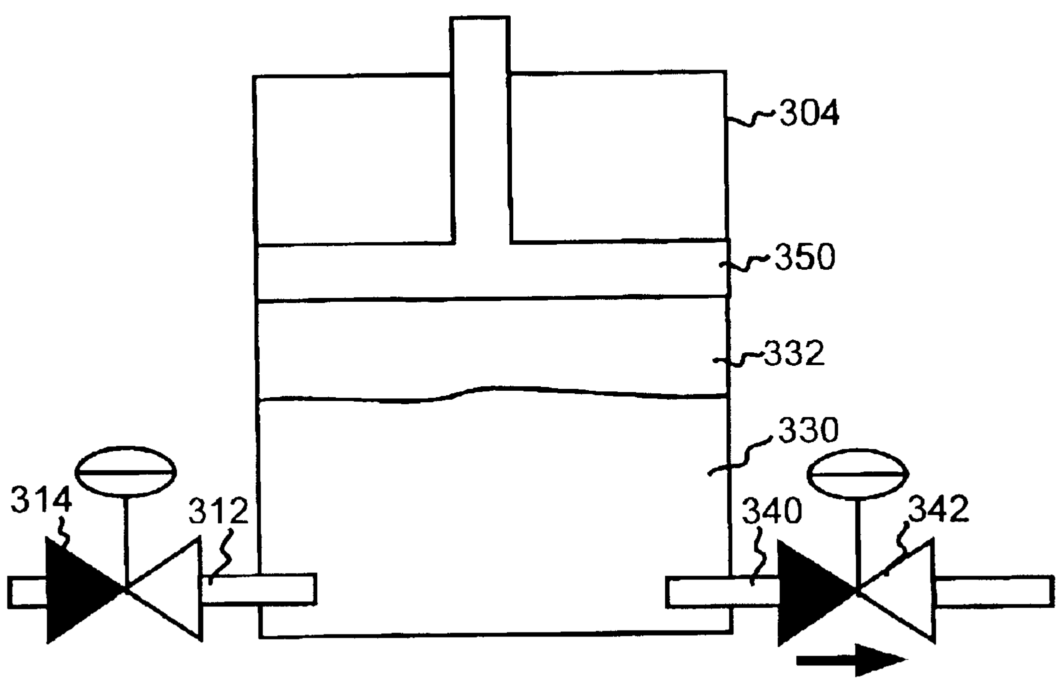

In operation, vessel 304 is provided with precursor 308 (step 104). The vessel 304 may be sold with the precursor, so that the vessel is used as a container that packages the precursor. Alternatively, an empty vessel 304 may be filled with precursor 308. Fluid is provided to the vessel 304 through the first check valve 314 and inlet 312 (step 108). A small amount of the fluid enters the precursor to lower the melting point of the precursor. The precursor is then melted (step 112). The melted precursor is then provided to the process chamber (step 116). FIG. 3B is a schematic illustration of the vessel 304 after the precursor 330 has been melted. Fluid 332 is above the precursor liquid 330. Fluid 332 consists of mostly supercritical fluid with a small amount of dissolved precursor. The piston 350 may be used to increase pressure in the vessel 304 to pump the melted precursor out of the outlet and into a processing chamber. A meter (not shown) may be used to meter the flow of the melted precursor (step 120). To provide the melted precursor, an end of the outlet should extend into the melted precursor, preferably proximate the bottom of vessel 304, as shown.

In one embodiment, the melted precursor may be delivered directly to the process chamber to provide a liquid with a very high precursor concentration to the process chamber. The melted precursor may be used for deposition on a wafer in a CVD process. In other embodiments, the precursor can be mixed with other solvents, reactants, or precursors of a different chemical nature.

Figure 4:
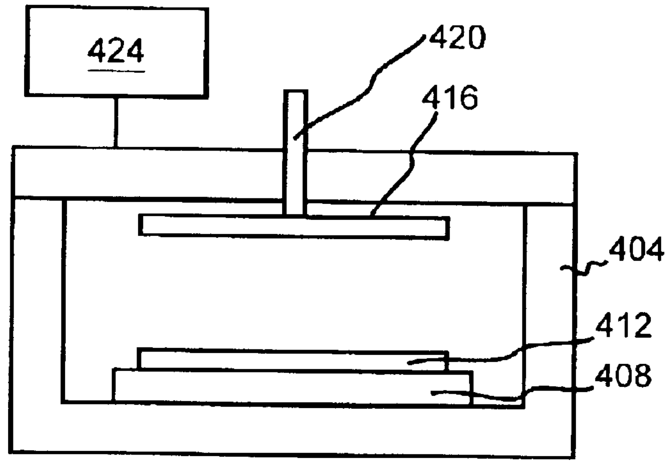
FIG. 4 is a more detailed view of a process chamber used in an embodiment of the invention.

FIG. 4 is a more detailed schematic view of the process chamber 244 that may be used in an embodiment of the invention. The process chamber 244 comprises chamber walls 404, a wafer support 408 which supports a wafer 412, and a sprinkler head 416 with an inlet 420 connected to the check valve 242 of FIG. 2B. A chemical vapor deposition (CVD) device 424 may form part of the process chamber 244. The melted precursor may be supplied through the inlet 420 to the sprinkler head 416 to provide melted precursor above the wafer 412. The CVD device 424 may provide direct deposition of the melted precursor. In this embodiment, the process chamber is a high pressure chamber, in which some of the processes are performed at high pressure.

By melting the precursor in a separate vessel, a faster wafer throughput may be provided, since a wafer does not need to remain in the same chamber with a solid precursor while the solid is melted or dissolved in order to provide a high concentration of precursor. In addition, melting the precursor in a separate chamber reduces the chance of particle contamination of the wafer from an undissolved solid precursor particle. The precursor may be melted and stored at the lower melting temperature for a period of time, possibly several weeks, until it is needed. The lower melting point may allow the precursor to be heated for longer periods of time without decomposing (e.g. many organometallics are heat labile). In addition, providing fluid to a process chamber may be much easier than adding solid precursor, since such process chambers may be high pressure process chambers, which may require several bolts to properly secure, and since it is much easier to measure fluid volumes. The addition of a liquid precursor also facilitates the use of a shower head or some other flow distribution device, which may improve wafer uniformity.

Examples of suitable supercritical fluids for use with this invention include supercritical fluid from at least one of carbon dioxide, ammonia, water, ethanol, ethane, propane, butane, pentane, dimethyl ether, hexafluoroethane, xenon, and mixtures thereof. One particularly preferred solvent is supercritical carbon dioxide.

For dilute solutions, the melting point depression of a solvent (component A) by a dissolved solute (component B) can be approximated by the following equation:

$$\Delta T_m = T_{fus,A} - T = \left(\frac{RT_{fus,A}^2}{\Delta_{fus}H_A^*}\right)x_B$$

where $\Delta T_m$ is the amount of melting point depression, R is the gas constant, $T_{fus,\,A}$ is the melting point of the solvent, T is the new melting point, $\Delta H_A°$ is the heat of fusion, and $X_B$ is the amount of solute dissolved in the solvent. In this case, the solvent will be the precursor. The solute dissolved in the liquid precursor is the supercritical fluid. It is convenient to think about a liquid precursor in equilibrium with a high pressure (supercritical) fluid at $T_e$ and $P_e$ where some of the high pressure fluid will dissolve in the liquid precursor at concentration, $X_B$. $T_e$ at equilibrium can be lower than $T_{fus,\,A}$ (i.e. $\Delta T_m$ is positive) because $X_B$ is nonzero in the above equation. Conversely, this means that if the solid precursor is exposed to the supercritical fluid at $T_e$ and $P_c$ the solid precursor will eventually melt because the equilibrium condition of the precursor at $T_c$ is liquid.

In theory, this can be done with any gas (or immiscible liquid) as long as the gas (or immiscible liquid) is sufficiently soluble in the liquid. In practice, for these purposes using a supercritical fluid ($CO_2$ in particular) is ideal because the same fluid is used in the reactor to dissolve the precursor. Therefore, since $CO_2$ has a strong attraction for the precursor, it will dissolve into the precursor liquid. Also, it will not be a detriment to this process. Low pressure gases will be unsuitable because they are not sufficiently soluble in the precursor liquid.

Figure 6:
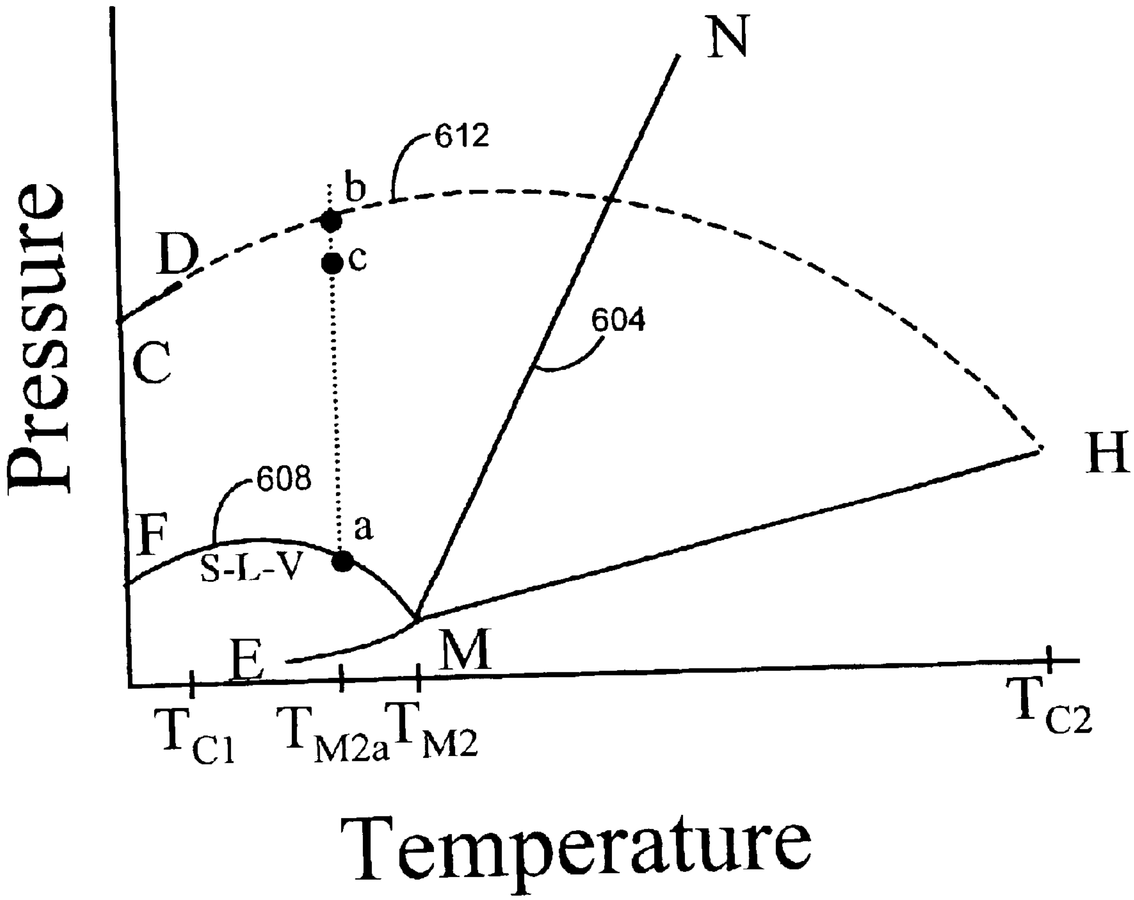
FIG. 6 is a pressure-temperature phase diagram of a typical solid-supercritical fluid.

FIG. 6 is a Pressure-Temperature phase diagram of a typical heavy solid-supercritical fluid. The solid is a first component and the fluid is a second component. The curve MN 604 is the normal melting curve of the solid. Generally (with the notable exception of water), the melting point of a solid increases with increasing pressure. However, in the presence of a supercritical fluid the melting curve bends back toward lower temperatures as shown by the curve FM 608. This curve is the S-L-V (solid, liquid, vapor) curve. Along this curve, there are three phases, a solid consisting of pure solid, liquid phase consisting of mostly solid with a small amount of dissolved fluid, and a fluid phase consisting of mostly fluid with small amounts of solid. For example, the normal melting point of solid is at $T_{M2}$. However, in the presence of fluid at P indicated by point “a”, the solid precursor begins to melt at temperature $T_{M2a}$, which is lower than the normal melting point. Point a lies on the S-L-V curve so at this point there will be three phases. Notice also that at point a the fluid component is above its critical temperature, but below its critical pressure (the critical point of fluid component is shown by point D. If the pressure is raised at constant $T_{M2a}$, the precursor melts completely and only two phases are present until point b is reached. Point b lies on the critical solution curve DH 612. Above this curve only one phase can exist. Notice that point b lies above the critical point of the fluid component. The preferred embodiment takes advantage of the region near point c, which is above the critical point of the solid, but below the critical solution curve.

An example of melting point depression in an organometallic is observed in high pressure carbon dioxide with (1,5-cyclooctadiene)dimethylplatinum(II), $CODPtMe_2$. The reported normal melting point of $CODPtiMe_2$ is 103–105° C. However, in the presence of $CO_2$ at pressures greater than about 125 bar at 60° C. the precursor condenses out of solution as a liquid. At lower temperatures (<50° C.), the precursor condenses out as a solid indicating that a phase boundary is encountered between the two conditions.

The melting point depression of $CODPtMe_2$ in the presence of $CO_2$ would allow storage of the precursor at pressures >125 bar of $CO_2$ at 60° C. The liquid precursor would then be fed to the reactor as a liquid.

Preferred layers for integrated circuit fabrication include, but are not limited to, a diffusion barrier, a conductive metal, a dielectric, an antireflective, an etch stop, a photoresist, a resistive, and an adhesion-seed layer. As described above, more than one such layer can be applied using methods and apparatus of the invention. As an example, when copper is used as a conductive route material patterned in dielectrics, typically a diffusion barrier is first applied to a dielectric material to inhibit diffusion of the subsequently deposited copper layer into the dielectric sub-layer. A damascene processing scenario will be described in relation to FIGS. 5A–D, which depict cross-sections of a wafer substrate produced using such methods.

Figure 5A:
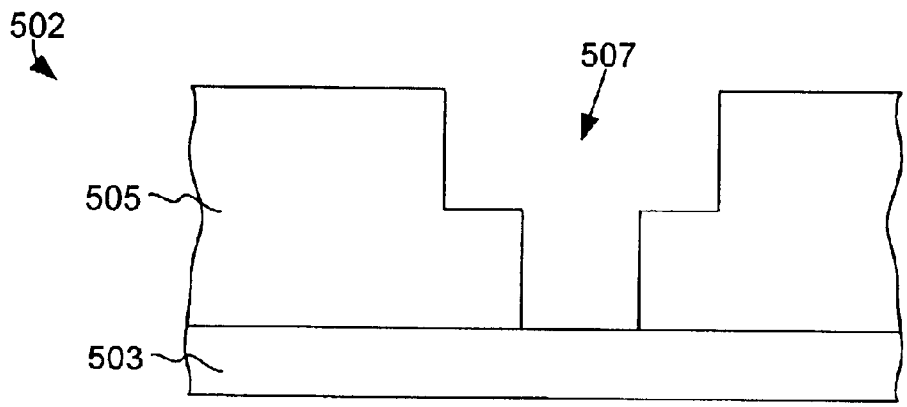
FIGS. 5A–D are cross-sectional views of portions of a wafer substrate being processed using embodiments of the invention.

First, a wafer may be provided to a supercritical reactor. An exemplary portion of such a wafer, 502, is depicted in FIG. 5A. Wafer 502 has an underlying copper conductive route 503 and a dielectric layer 505. Dielectric layer 505 has a plurality of surface features, for example feature 507, etched into it. The dielectric layer 505 may be made of POSS-materials. The POSS-materials may include at least one of octavinyl-POSS, methacrylfluoro-3-POSS, and methacrylfluoro-13-POSS. Description of POSS-materials and methods for depositing POSS solid precursors on wafers to form dielectric layers using supercritical media are described in U.S. patent application Ser. No. 09/727,796, by Van Cleemput et al., entitled, "Dielectric Films with Low Dielectric Constants," which is herein incorporated for all purposes. Several of the POSS materials may interact with $CO_2$ enough that the melting point could be depressed in the presence of $CO_2$. This would allow them to be delivered as a liquid to a deposition reactor.

Figure 5B:
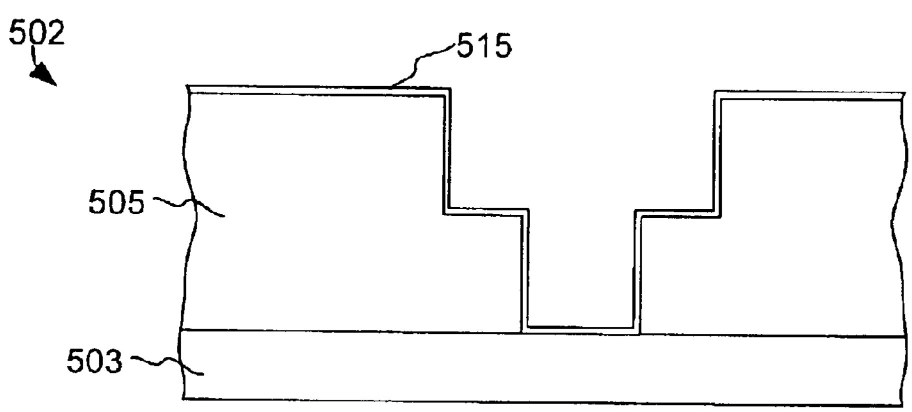

Referring to FIG. 5B, a conformal diffusion barrier 515 has been deposited on the dielectric. Preferably the diffusion barrier material includes at least one of tantalum, tantalum nitride, titanium, titanium nitride, tungsten, tungsten nitride, cobalt, nickel, indium, tin, platinum, palladium, ruthenium oxide, and ruthenium. In order to deposit such materials, preferably a precursor material is delivered to the wafer and then converted to one of the diffusion barrier materials listed above. Preferably, such precursors will include at least one of ruthenocene, cobaltocene, cobalt(II)acetonylacetonate, cobalt(III)tetramethyl-heptadionate, and tantalum(V) tetraethoxide-2,4-pentadionate. These precursors could be delivered by melting in the presence of a supercritical fluid, according to the invention. The normal melting points for some of these precursors are as follows: Cu(II)acac (165–170° C.), Cu(III)tmhd (250° C.), ruthenocene (194° C.). The amount of melting point depression will depend on the affinity of $CO_2$ and the liquid precursor.

Figure 5C:
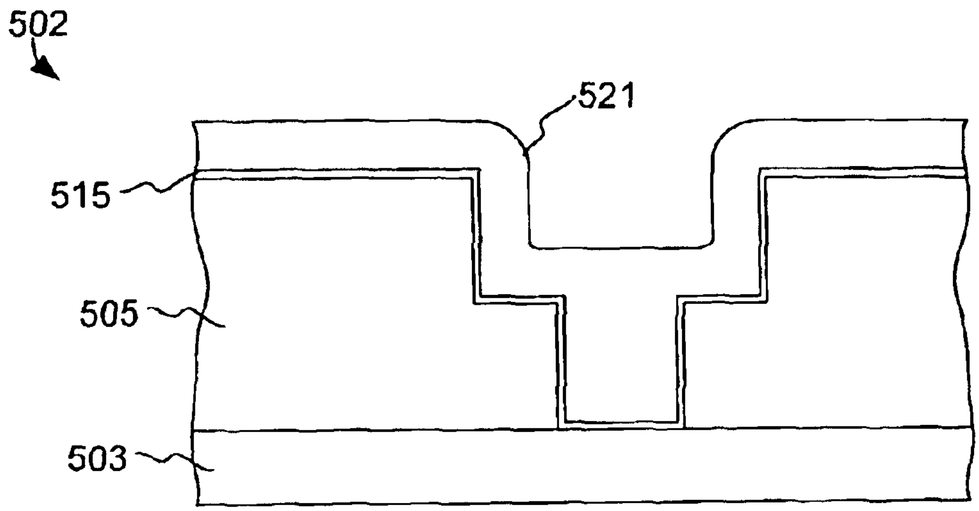
Figure 5D:
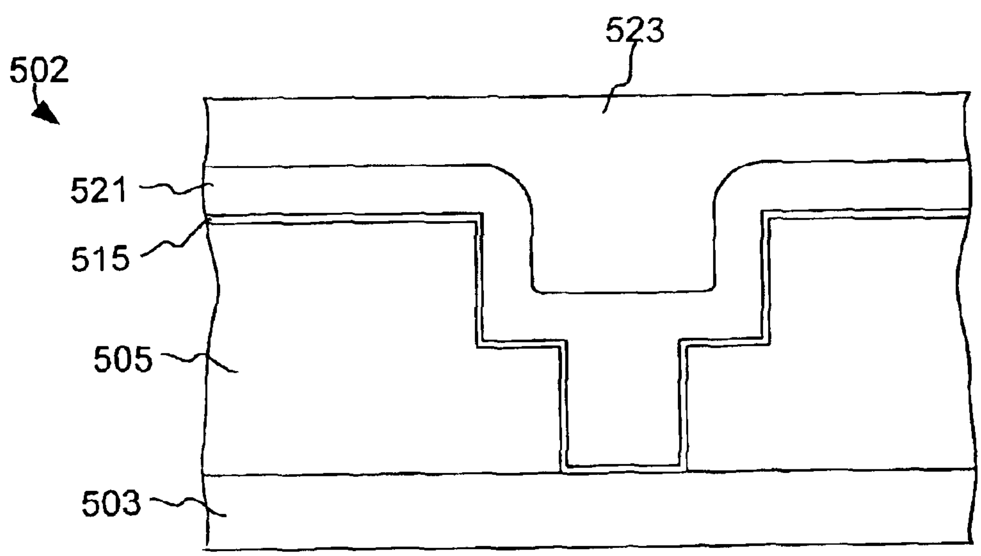

FIG. 5C shows the result when a copper layer, 521, is deposited using a precursor, for example including at least one of copper(II)tetramethylheptadionate, copper(II) trimethyloctanedionate, and copper(II)acac, Cu(II)hfac, Cu(I)hfac(2-butyne, Cu(I)hfac(cyclooctadiene). These precursors could also be delivered by melting in the presence of a supercritical fluid, according to the invention. The normal melting points for some of these precursors are as follows: Cu(II)tmhd (200° C.), Cu(II)tmod (120° C.), $Cu(hfac)_2$ (130° C.), and $Cu(acac)_2$ (284–288° C.). Such depositions may provide excellent coverage of the wafer surface, and obviate the need for PVD seed layer. Copper layer 521 provides a conformal seed for subsequent bottom up electrofill. In another embodiment layer 521 fills the bottom most via replacing bottom up electrofill. As such, bulk electrofill (rather than intricate bottom up type processes) can be used to complete the fill of the features, or alternatively another copper deposition can be employed. The result of such processes is depicted in FIG. 5D. Copper layer 523 is deposited on top of copper layer 521 to a point sufficient for subsequent planarization of the metal back to the field dielectric.

U.S. patent application Ser. No. 10/016,017, entitled "Method and System for Introduction of Solid Precursor and Reactants into a Supercritical Fluid Reactor", by Sanjay Gopinath et al., filed Dec. 12, 2001 and incorporated by reference for all purposes, discloses an apparatus and methods for dissolving solid precursors in supercritical media to create solutions of the precursors. Such apparatus may be modified using the principles of the present invention to deliver the melted precursor to the process chamber and further mixing the melted precursor with a supercritical fluid and other additives in a continuous manner.

While this invention has been described in terms of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for providing a precursor to a super critical processing chamber, comprising:

providing the precursor in solid form in a vessel external to the supercritical processing chamber;

providing a fluid to the vessel, wherein at least a portion of the fluid enters the solid precursor causing a melting point depression of the precursor;

melting the solid precursor to turn the solid precursor into a melted liquid precursor; and delivering the melted liquid precursor to the supercritical processing chamber.

2. The method, as recited in claim 1, further comprising heating the solid precursor to a temperature above the depressed melting point.

3. The method, as recited in claim 2, wherein the fluid is a supercritical fluid.

4. The method, as recited in claim 3, wherein the supercritical fluid is selected from the group including carbon dioxide, ammonia, water, ethanol, ethane, propane, butane, pentane, dimethyl ether, hexafluoroethane, and mixtures thereof.

5. The method, as recited in claim 3, wherein the delivering the melted liquid precursor, comprises the step of pumping the melted liquid precursor from the vessel.

6. The method, as recited in claim 3, wherein the pumping the melted liquid precursor comprises increasing the pressure in the vessel.

7. The method, as recited in claim 1, wherein the precursor comprises at least one of $CODPtMe_2$, Cu(II) tetramethylhepatanedionate, Cu(II)trimethyloctanedionate, Cu(II)hexafluoroacetylacetonate, Co(II)acetylacetonate, POSS compounds, cobaltocene, ruthenocene, Cu(I) hexafluoroacetylacetonate(cyclooctadiene), Cu(I) hexafluoroacetylacetonate(2-butyne), Co(III) tetramethyleheptanedionate.

8. The method, as recited in claim 7, wherein the fluid is a supercritical fluid selected from the group including carbon dioxide, ammonia, water, ethanol, ethane, propane, butane, pentane, dimethyl ether, hexafluoroethane, and mixtures thereof.

9. The method, as recited in claim 1, further comprising converting the fluid to a supercritical fluid before delivering the melted precursor to the supercritical processing chamber.

10. The method, as recited in claim 1, further comprising measuring the amount of melted liquid precursor delivered to the supercritical processing chamber.

11. The method, as recited in claim 1, wherein the delivering the melted liquid precursor has a higher concentration of liquid precursor than concentration of fluid.

* * * * *